(12) United States Patent
Makuta

(10) Patent No.: US 7,135,938 B2
(45) Date of Patent: Nov. 14, 2006

(54) SURFACE-MOUNT CRYSTAL OSCILLATOR

(75) Inventor: Toshikatsu Makuta, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 10/456,007

(22) Filed: Jun. 6, 2003

(65) Prior Publication Data
US 2003/0227339 A1    Dec. 11, 2003

(30) Foreign Application Priority Data
Jun. 6, 2002    (JP) .............................. 2002-166273

(51) Int. Cl.
*H03B 5/32* (2006.01)
(52) U.S. Cl. ............... 331/158; 331/66; 331/116 R; 331/116 FE; 331/108 C
(58) Field of Classification Search ............... 331/158, 331/116 R, 108 C, 116 FE, 68, 66
See application file for complete search history.

(56) References Cited

U.S. PATENT DOCUMENTS 5,815,000 A * 9/1998 Farnworth et al. .......... 324/755

* cited by examiner

*Primary Examiner*—Arnold Kinkead
(74) *Attorney, Agent, or Firm*—Katten Muchin Rosenman LLP

(57) ABSTRACT

A surface-mount quartz crystal oscillator has a casing substantially in the shape of a substantially rectangular parallelepiped, the casing having a recess defined therein, a pair of upper steps disposed in the recess, a lower step disposed in the recess and having electrically conductive pads thereon, a crystal blank having an end secured to one of the upper steps and an opposite end placed on the other of the upper steps, and an IC chip disposed on the bottom of the recess and electrically connected to the electrically conductive pads by wires according to wire bonding, the IC chip including a circuit, the circuit and the crystal blank jointly making up an oscillating circuit. The wires extend in a direction substantially perpendicular to a longitudinal direction of the casing.

6 Claims, 2 Drawing Sheets

SURFACE-MOUNT CRYSTAL OSCILLATOR

BACKGROUND OF THE INVENTION

1. Field of the Invention

The present invention relates to a surface-mount quartz crystal oscillator, and more particularly to a surface-mount crystal oscillator which is highly resistant to shock and highly productive.

2. Description of the Related Art

Surface-mount quartz crystal oscillators which have a quartz crystal unit and an oscillating circuit using the crystal unit, both housed in a surface-mount casing, are small in size and widely used as a frequency or time reference source, for example, in portable devices and the like. One application of such a surface-mount crystal oscillator is as a crystal oscillator serving as a synchronizing signal source, i.e., so-called SPXO (simple packaged crystal oscillator). Surface-mount crystal oscillators which are presently dominant in the art have planar profile dimensions of 7 mm×5 mm.

FIGS. 1A and 1B show a conventional surface-mount crystal oscillator by way of example. As shown in FIGS. 1A and 1B, the conventional surface-mount crystal oscillator comprises casing 1 having a substantially rectangular parallelepiped as an outer shape and planar profile dimensions of 7 mm×5 mm, for example, IC (integrated circuit) chip 2, quartz crystal blank 3, and cover 9 sealing a recess defined in casing 1. Casing 1 is made of laminated ceramic and has the recess defined therein. Casing 1 which is made of the laminated ceramic is of a four-layer structure made up of bottom wall layer 1a, first intermediate layer 1b, second intermediate layer 1c, and top wall layer 1d. Of these layers, first intermediate layer 1b, second intermediate layer 1c, and top wall layer 1d have respective substantially rectangular openings defined therein, which are progressively larger in the named order of the layers. As a result, the openings jointly serve as the recess in casing 1, providing two steps, i.e., upper steps 4a and lower steps 4b, on the inner wall of the recess. Upper steps 4a are positioned at opposite ends of the recess in a longitudinal direction of casing 1. Lower steps 4b are positioned at the opposite ends of the recess in the longitudinal direction of casing 1 and also at opposite ends of the recess in a transverse direction of casing 1, and hence extend in a frame manner in the recess. One of upper steps 4a has a central trench extending downwardly to the upper surface of corresponding lower step 4b, and is divided into two segments by the central trench. Electrically conductive pads are disposed on upper surfaces of lower steps 4b which are positioned at the opposite ends of the recess in the longitudinal direction of casing 1. Connecting electrodes, not shown, for electrical and mechanical connection to crystal blank 3 are disposed on the upper surfaces of the divided segments of upper step 4a. Although not shown, mounting terminals extend from an outer bottom surface to a side surface of casing 1, and serve to provide electrical connection to a circuit pattern on a wiring board. The mounting terminals and the electrically conductive pads disposed on lower steps 4b are electrically connected to each other by through holes or the like defined in casing 1, and the electrically conductive pads and connecting terminals on upper steps 4a are electrically connected to each other by a circuit pattern or the like disposed in the recess in casing 1.

IC chip 2 is electrically connected to crystal unit 3, and provides an oscillating circuit using crystal unit 3. IC chip 2 contains an integrated assembly of an oscillating amplifier and capacitors. Terminals 12 including a power supply terminal, ground terminal, and output terminal are mounted on opposite ends of one of principal surfaces of IC chip 2. The other principal surface of IC chip 2 is fixed to the bottom of the recess in casing 1, i.e., an upper surface of bottom wall layer 1a. Electrically conductive pads 11 on the upper surfaces of lower steps 4b and terminals 12 on IC chip 2 are connected by gold wires 5 according to a wire bonding process. Gold wires 5 extend substantially in the longitudinal direction of casing 1. IC chip 2 has a planar profile size which is typically of 1.2 mm×1.3 mm. IC chip 2 as mounted in casing 1 has its longitudinal axis aligned with the longitudinal direction of casing 1.

As shown in FIG. 1C, crystal blank 3 is of a substantially rectangular shape, for example, and comprises an AT-cut quartz crystal blank. Crystal blank 3 has a planar size of 5 mm×3 mm, for example. The AT-cut crystal blank has its resonant frequency determined by its thickness. Crystal blank 3 has a pair of excitation electrodes 6 disposed respectively on opposite principal surfaces thereof. From excitation electrodes 6, there extend respective extension electrodes 7 toward respective opposite ends of one side of crystal blank 3. In the shown example, extension electrodes 7 extend the opposite ends of one shorter side of crystal blank 3. The opposite ends of the one side of crystal blank 3 to which extension electrodes 7 extend are bonded to the upper surfaces of upper step 4a where the connecting electrodes are disposed, by electrically conductive adhesive 8. The other end of crystal blank 3, which opposes to the one side of crystal blank 3, is placed in abutment against the upper surface of upper step 4a which is not divided. Crystal blank 3 is thus held in casing 1 and electrically connected to casing 1. The end of crystal blank 3 which is bonded by electrically conductive adhesive 8 acts a fixed end, whereas the end of crystal blank 3 opposite to the fixed end as a free end.

Since IC chip 2 and electrically conductive pads 11 are connected to each other by gold wires 5 according to a winding bonding technique on longitudinally opposite ends of casing 1, and gold wires 5 extend in the longitudinal direction of casing 1, a space can easily be provided for wire bonding operation in this crystal oscillator. For example, a capillary of the wire bonding apparatus can easily be guided to lower steps 4b. As the other end, i.e., the free end, of crystal blank 3, is placed on upper step 4a, the one end, i.e., the fixed end, of crystal blank 3, can easily be bonded in position by electrically conductive adhesive 8, and the free end is prevented from vertically swinging for protection against damage to crystal blank 3 when external mechanical shocks are applied to the crystal oscillator. Therefore, the crystal oscillator can be manufactured highly efficiently and is highly resistant to shocks.

As the oscillating frequency of the surface-mount crystal oscillator goes higher, i.e., is in a range from 100 to 170 MHz, AT-cut crystal blank 3 has a much smaller thickness, and tends to be fractured. As a result, the free end of crystal blank 3 which is merely placed on upper step 4a is not sufficiently strong to prevent crystal blank 3 from being broken. It has been attempted to coat cover 9 with an insulative adhesive over the free end of crystal blank 3, forming a protrusion projecting into the recess in casing 1 to reduce the range of vertical swinging of crystal blank 3. However, forming such a protrusion on cover 9 makes the assembly process longer and more complex. In addition, because the protrusion tends to secure crystal blank 3 substantially at its opposite ends, stresses are liable to concentrate on a central region of crystal blank 3, crystal blank 3 is likely to be broken at its central region.

SUMMARY OF THE INVENTION

It is an object of the present invention to provide a surface-mount crystal oscillator which is highly shock-resistant and productive.

According to the present invention, the above object can be achieve by a surface-mount crystal oscillator having a casing substantially in the shape of a substantially rectangular parallelepiped, the casing having a recess defined therein, a pair of upper steps disposed in the recess, a lower step disposed in the recess and having electrically conductive pads thereon, a crystal blank having an end secured to one of the upper steps and an opposite end placed on the other of the upper steps, and an IC chip disposed on the bottom of the recess and electrically connected to the electrically conductive pads by wires according to wire bonding, the IC chip including a circuit, the circuit and the crystal blank jointly making up an oscillating circuit, the wires extending in a direction substantially perpendicular to a longitudinal direction of the casing.

Generally, a quartz crystal blank has its oscillating characteristics kept well if its thickness is reduced even though its planar area is reduced. If the crystal blank is reduced in size, then it is less vulnerable to physical damage. The present invention has been made in view of these features. With the conventional crystal oscillator, if the crystal blank is reduced in size, then the free end of the crystal blank cannot be placed on the other upper step. According to the present invention, the wires used for wire bonding are oriented in a direction which is 90° different from the conventional direction in order to allow the free end of the crystal blank, which is reduced in size, to be placed on the other upper step. With this arrangement, even through the crystal blank is small in size, the free end of the crystal blank is placed on the other upper step. Therefore, a surface-mount crystal oscillator which is highly shock-resistant and productive can be obtained.

DETAILED DESCRIPTION OF THE INVENTION

Figure 1A:
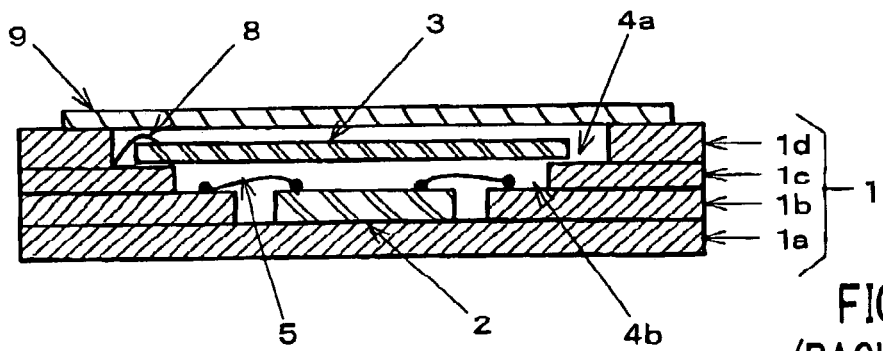
FIG. 1A is a cross-sectional view of a conventional surface-mount quartz crystal oscillator.
Figure 1B:
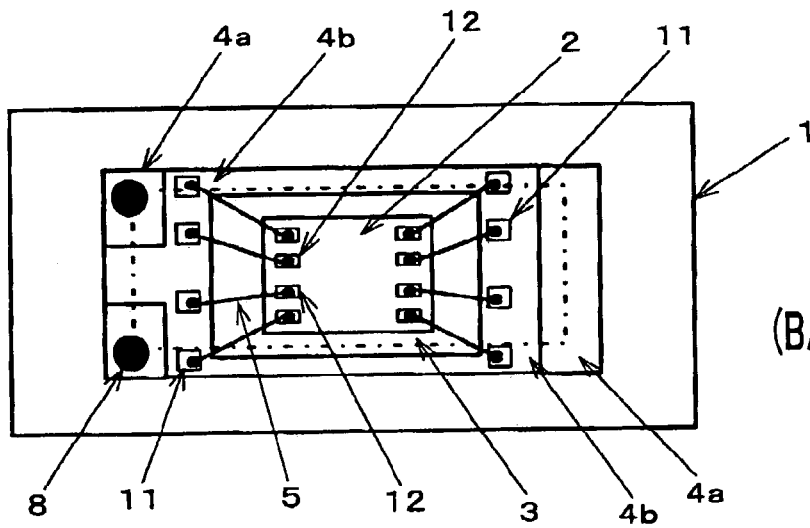
FIG. 1B is a plan view of the crystal oscillator shown in FIG. 1A with a cover removed.
Figure 2A:
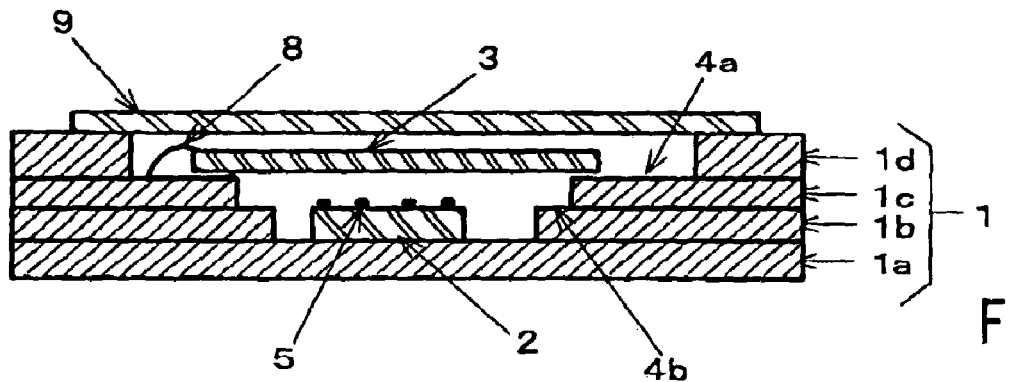
FIG. 2A is a cross-sectional view of a surface-mount quartz crystal oscillator according to an embodiment of the present invention.
Figure 2B:
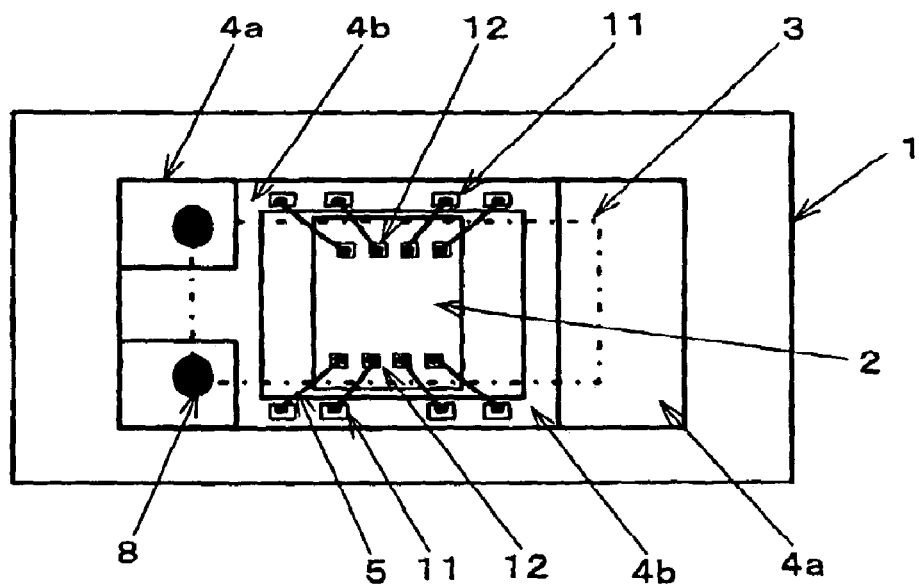
FIG. 2B is a plan view of the crystal oscillator shown in FIG. 2A with a cover removed.

FIGS. 2A and 2B show a surface-mount quartz crystal oscillator according to a preferred embodiment of the present invention. Those parts of the surface-mount crystal oscillator shown in FIGS. 2A and 2B which are identical to those shown in FIGS. 1A and 1B are denoted by identical reference characters, and will not be described below.

The surface-mount crystal oscillator shown in FIGS. 2A and 2B comprises casing 1 having a substantially rectangular parallelepiped as an outer shape and a recess defined in one principal surface thereof, IC chip 2 and AT-cut quartz crystal blank 3 which are housed in casing 1, and cover 9 covering the opening of the recess to hermetically encapsulate IC chip 2 and AT-cut crystal blank 3 therein. Casing 1 has planar profile dimensions of 7 mm×5 mm. Crystal blank 3 has a substantially rectangular shape having dimensions of 3 mm×1.4 mm, smaller than the conventional crystal blank. Similar to the conventional one shown in FIG. 1C, crystal blank 3 has excitation electrodes 6 and extension electrodes 7 formed thereon.

Similar to the crystal oscillator described above, casing 1 is of a four-layer structure of laminated ceramics having bottom wall layer 1a, first intermediate layer 1b, second intermediate layer 1c, and top wall layer 1d of these layers, first intermediate layer 1b, second intermediate layer 1c, and top wall layer 1d have respective substantially rectangular openings defined therein, which jointly serve as the recess in casing 1, providing two steps, i.e., upper steps 4a and lower steps 4b.

Figure 1C:
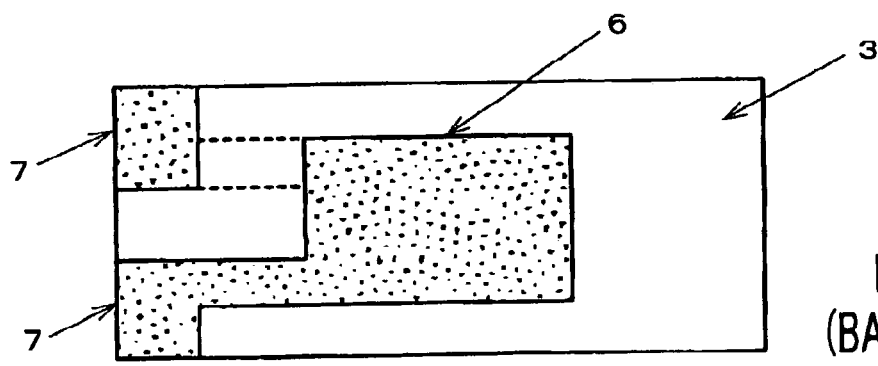
FIG. 1C is a plan view of a crystal blank.

Because crystal blank 3 in this crystal oscillator is smaller than the conventional crystal blank, the lengths of the openings defined in first intermediate layer 1b and second intermediate layer 1c in the longitudinal direction of casing 1 are smaller than the respective lengths of the openings in the conventional casing shown in FIGS. 1A and 1E. Particularly, upper steps 4a on opposite sides of the recess in casing 1 are close to each other, and the spacing between upper steps 4a is smaller than the length of crystal blank 3 in the longitudinal direction such that the opposite ends of crystal blank 3 are placed on respective upper steps 4a across the recess. A pair of connecting electrodes are formed on one of upper steps 4a. The opposite ends of the one side of crystal blank 3 to which extension electrodes 7 extend are bonded to the connecting terminals by electrically conductive adhesive 8. Crystal blank 3 is thus held in casing 1.

In the crystal oscillator according to the present embodiment, electrically conductive pads 11 for use in connection to IC chip 2 are formed on lower steps 4b along longitudinal sides of casing 1. In other words, electrically conductive pads 11 are formed on lower steps 4b on transversely opposite sides of casing 1. IC chip 2 is identical to the IC chip shown in FIGS. 1A and 1B, but is oriented in a different direction with respect to the bottom of the recess in casing 1. Specifically, IC chip 2 has its longitudinal direction perpendicular to the longitudinal direction of casing 1. As a result, terminals 12 disposed on longitudinally opposite ends of IC chip 2 are disposed in facing relation to electrically conductive pads 11 on lower steps 4b. Electrically conductive pads 11 and terminals 12 of IC chip 2 are interconnected by gold wires 5 according to a wire bonding process. Gold wires 5 extend in a direction perpendicular to the longitudinal direction of casing 1.

Mounting electrodes are disposed on an outer surface of casing 1, the connecting electrodes are electrically connected to electrically conductive pads 11, and electrically conductive pads 11 are electrically connected to the mounting electrodes in the same manner as with the conventional crystal oscillator described above.

With the surface-mount crystal oscillator according to the present embodiment, since the profile of crystal blank 3 has a size of 3 mm×1.4 mm rather than the conventional size 5 mm×3 mm, the planar area of crystal blank 3 is about 1/3.6 of the planar area of the conventional crystal blank. Therefore, crystal blank 3 is prevented from being damaged when it is subjected to external shocks. As crystal blank 3 of the crystal oscillator has a high resonant frequency, even though the planar area of crystal blank 3 is reduced to the above size, crystal blank 3 has its oscillating characteristics kept well because the planar area of crystal blank 3 is sufficiently large with respect to the thickness thereof. Furthermore, inasmuch as upper steps 4a on the opposite sides of the recess in the longitudinal direction of casing 1 are close to each other, the fixed end of crystal blank 3 can be fixed to one of upper steps 4a and the free end of crystal blank 3 can be placed on the other one of upper steps 4a. Therefore, crystal blank 3 can be secured in position highly efficiently, and is highly shock-resistant as the free end of crystal blank 3 is prevented from swinging when subjected to shocks.

According to the present embodiment, terminals 12 of IC chips 2 and electrically conductive pads 11 on lower steps 4b of casing 1 may be so close to each other that a capillary of the wire bonding apparatus may not easily be inserted into position. In such a case, the capillary should have a slender tip for easy insertion.

According to the present embodiment, since crystal blank 3 is of a relatively small size, the number of crystal blanks that can be taken from one quartz crystal wafer is greatly increased. In addition, gold wires 5 used for wire bonding may be short, and hence the amount of gold consumed to produce gold wires 5 may be small. As a consequence, the productivity of the crystal oscillator is increased.

What is claimed is:

1. A surface-mount crystal oscillator comprising:
   a casing substantially in a shape of a substantially rectangular parallelepiped, said casing having a recess defined therein;
   a pair of upper steps disposed in said recess;
   a lower step disposed in said recess and having electrically conductive pads thereon;
   a crystal blank having an end secured to one of said upper steps and an opposite end placed on the other of said upper steps; and
   an IC chip disposed on the bottom of said recess and electrically connected to said electrically conductive pads by wires according to wire bonding, said IC chip including a circuit, said circuit and said crystal blank jointly making up an oscillating circuit;
   wherein said electrically conductive pads are formed only on said lower step along a longitudinal side of the casing;
   wherein said electrically conductive pads are no provided along a shorter side of the recess of the casing.

2. The crystal oscillator according to claim 1, wherein said crystal blank is of a substantially rectangular shape.

3. The crystal oscillator according to claim 2, wherein said crystal blank composes an At-cut quartz crystal blank.

4. The crystal oscillator according to claim 1, wherein said casing is made of laminated ceramics.

5. The crystal oscillator according to claim 1, wherein said IC chip has a substantially rectangular planar shape and has terminals on longitudinally opposite ends, said terminals being connected to said electrically conductive pads by said wires.

6. The crystal oscillator according to claim 1, wherein said casing has planar profile dimensions of 7 mm×5 mm.

* * * * *